United States Patent [19]

Englehardt

[11] Patent Number: 5,477,511
[45] Date of Patent: Dec. 19, 1995

[54] PORTABLE DOCUMENTATION SYSTEM

[76] Inventor: C. Duane Englehardt, 4 Phelps Way, Carmel Valley, Calif. 93924

[21] Appl. No.: 274,384

[22] Filed: Jul. 13, 1994

[51] Int. Cl.$^6$ ................................................. G11B 20/02
[52] U.S. Cl. ................................................. 369/25; 381/44
[58] Field of Search ........................... 369/25, 27; 381/36, 381/41, 42, 43, 44, 51, 52, 53; 379/75

[56] References Cited

U.S. PATENT DOCUMENTS

| | | | |
|---|---|---|---|
| 4,318,188 | 3/1982 | Hoffmann | 365/45 |
| 4,661,915 | 4/1987 | Ott | 381/51 |
| 4,811,397 | 3/1989 | Nakajima | 381/36 |
| 4,829,576 | 5/1989 | Porter | 381/51 |
| 4,905,289 | 2/1990 | Micic et al. | 381/51 |
| 4,908,866 | 3/1990 | Goldwasser et al. | 381/44 |
| 5,031,113 | 7/1991 | Höllerbauer | 381/44 |
| 5,136,655 | 8/1992 | Bronson | 381/41 |
| 5,197,052 | 3/1993 | Schröder et al. | 369/25 |
| 5,218,864 | 6/1993 | Morio et al. | 381/30 |
| 5,235,571 | 8/1993 | Ellermeier | 369/25 |
| 5,319,620 | 6/1994 | Hohenbuchler et al. | 369/25 |

OTHER PUBLICATIONS

"Norris Communications Target Computer Market With Digital Recorder", *Speech Recognition Update;* May 1994; pp. 1 and 14 (as enclosed–one sheet).

Alex Mendelsohn; "Virtual Company Tackles Hand–Held Voice Mail"; *Computer Design's OEM Integration*, Mar. 1994; pp. 19–22.

"Digital Personal Recording Device"; *Product Profiles;* May/Jun. 1994; p. 30.

Don Clark; "Norris Plans to Launch Digital Recorder Using Flash Memory Chips from Intel"; *The Wall Street Journal;* Mar. 28, 1994; p. B6.

Doug van Kirk; "Infrared Standard Could Bring Easier Communications to PCs"; Mar. 14, 1994.

*Primary Examiner*—Georgia Y. Epps
*Assistant Examiner*—Tan Dinh
*Attorney, Agent, or Firm*—Patrick T. Reilly; James J. Leary; Carol A. Duffield

[57] ABSTRACT

Disclosed are means and method to implement a portable and fully functional audio data recording and processing system. Voice data is received, converted to digital representations, compressed and stored in solid state memories. Predefined and user defined data categories are established to enable the operator to efficiently organize data recording and retrieval actions. Data transmission means are provided, and transcription from spoken word to textual information is supported. The use of the present invention as a documentation instrument is described. The integration of the invention with a Charge Coupled Device for recording visual information is presented.

2 Claims, 4 Drawing Sheets

PORTABLE DOCUMENTATION SYSTEM

BACKGROUND OF THE INVENTION

1. Field of the Invention

The present invention relates to devices and techniques that enable general purpose applications of audio and video data documentation, recording, retrieval, transmission, organization and management. The present invention further relates to the data processing of information contained in human voice communications by means of portable electronic equipment.

2. Description of Prior Art

There has been a long felt need to provide data processing and transmission capabilities with an easily operable and portable means. This is supported by an analysis of both the commercial successes of bar code reading systems, Personal Digital Assistant (PDA) offerings, and digital organizers, and of new design trends in the areas of voice recording and audio data organizing devices.

Bar code reading hardware can be quite compact, but has an extremely narrow scope of application. As bar code reading requires the prior labeling of an object with a very specific data coding protocol, these systems have not to date been effectively used as efficient and general purpose data recording devices.

PDA's are typically palm-sized digital electronics devices which use a touch screen and a light sensitive stylus, or pen, for data display and pen based data input. Touch screens used with pen-like devices for character input are diminished in usefulness by time delays in character interpretation and high error rates. In addition, the ability and willingness of the user to handwrite characters consistently legible to the system software is a barrier to widespread acceptance of this technology.

Pen based data input systems require significant investment in operator training time. Most commercially available pen based systems are designed to learn and best recognize the handwriting characteristic of only one designated operator. This approach, though improving system efficiency, results in the highly personalized hardware sets that are of limited flexibility.

Digital data organizers require the operator to input data via an alphanumeric keyboard. As such, size reduction of these devices is inhibited by the need to present a surface area sufficient to allow for rapid selection of a large number of keys. Pocket sized models in particular can be very awkward to use. Most digital data organizers cannot be used safely during a wide variety of common daily activities, such as operating heavy equipment or driving a car.

Micro-cassette recorders are widely used as dictation machines. Most current designs allow for one handed operation, which allows for convenient use in many situations. Data, however, is recorded sequentially, and usually recovered by time consuming and inefficient retrieval functions. Some micro-cassettes record data with digital data storage means and/or index voice data to allow pseudo-random access. In these cases, however, access speed remains limited by the speed of the tape mechanism.

Digital voice organizer design directions offer the most promise in convenient, possibly even hands-free, operation of portable audio data processing equipment developments. Voice Powered Technology currently offers for sale a Voice Organizer product that uses voice recognition technology to organize audio data input. This system is advertised to support up to 99 separate verbal messages and 400 phone number records. The Voice Organizer is described in promotional literature to be able to relate specific names to specific phone numbers using only voice recognition methods.

Norris Communications has also recently developed a digital audio recording device. Marketed under the model name Flashback, this system is able to download digital representations of voice recordings as sound files to PDA's and PCMCIA compatible equipment. The Flashback uses flash memory chips for audio data storage, that retain stored data values during power-off states.

Norris Communications has published its intention to eventually provide data exchange between future Flashback models and personal computers and PDA's. This connectivity will be available through PCMCIA media and direct infrared data transmission.

A review of the patent record of related prior art especially shows numerous attempts to provide improved methods and devices for the management and processing of recorded audio data.

Schroeder et al. (U.S. Pat. No. 5,197,052, Mar. 23, 1993) describes the integration of dictation system with a digital computer. The voice data is recorded in a simplistic manner, and is merely stored for later audio playback. No attempt at portability is discussed, and no further data processing operations are considered.

Micic et al. (U.S. Pat. No. 4,905,289, Feb. 27, 1990) disclose the storage of digitized audio signals in read only memory (ROM). The focus of implementation of the invention of Micic et al is to avoid the necessity of mechanically moving components of the audio playback system.

Ellermeier (U.S. Pat. No. 5,235,571, Aug. 10, 1993) presents an ergonomically improved dictation machine control lever design. The proposed design is held within one hand, and is intended to be comfortably used for long periods of time. Operator comfort is the advantage considered by the invention of Ellermeier. Audio data processing capabilities and improvements are not addressed.

No related prior art attempts to provide a portable means to record, organize, and transmit voice data into a personal computer for conversion to text representation within a pre-formatted documentation process.

It is apparent from a thorough examination of the related prior art that conventional audio data acquisition systems are not designed to be efficiently used as means to transcribe spoken words into textual notations within digitally recorded documentary systems.

The introduction of a truly portable and easy to use audio data processing and management system would be beneficial in a wide variety of applications, to include inventory activities, insurance estimation, journalism, emergency services, and military and police operations.

SUMMARY OF THE INVENTION

Accordingly, it is an object of the present invention to provide a portable apparatus and a method to allow an operator to record audio data.

This and other objects are achieved by providing a compact device that detects valid audio data, and then digitizes, compresses and stores the selected data. This stored data can be accessed in playback mode through a speaker.

All data is stored in either user designated locations or default locations of the device directory. The directory is programmable, and defined by the device operating system. A directory design may include informational designations of a highly formatted document, such as a vehicular accident report, that will be used by a specific type of user in a narrow range of situations.

Alternate preferred embodiments prompt the user for data input by means of audio transmissions from the device. The questioning of the user by the present invention in this manner efficiently guides the user through a documentation data structure and minimizes the user's reliance on visual prompts from alphanumeric character display circuitry.

The documentary record is stored as simple digitized voice data. The present invention includes transmission means, such as an infrared emitter, to deliver the digitized audio record to a personal computer or workstation. The support computer transcribes the audio data into text, by means of Automatic Voice Recognition algorithms (re Speech Systems and Dragon Systems products).

Certain embodiments of the present invention will accept imaging data from a Charge Coupled Device (CCD). A real-time clock provides time and date stamping function, and is used to associate a specific CCD image file with narrative text.

Alternate preferred embodiments accept PCMCIA memory cards, and thus expand the recording capacity of the operator in the field.

Voice recognition software is integrated into the device operating system of certain preferred embodiments, allowing audio data to be recorded as input to label and define new directory locations, which can then be selected by the operator's spoken command.

Documentary data structure definitions can be read by and written into the operating systems of certain preferred embodiments of the present invention from several means, to include: PCMCIA memory cards, infrared data transmissions, manipulation of a keyboard data entry module, or voice prompting by an operator.

DETAILED DESCRIPTION OF A PREFERRED EMBODIMENT

The following detailed description of the present invention is meant to be illustrative only and not limiting. Other embodiments of this invention will be obvious to those skilled in the art in view of the following disclosure.

Figure 1:
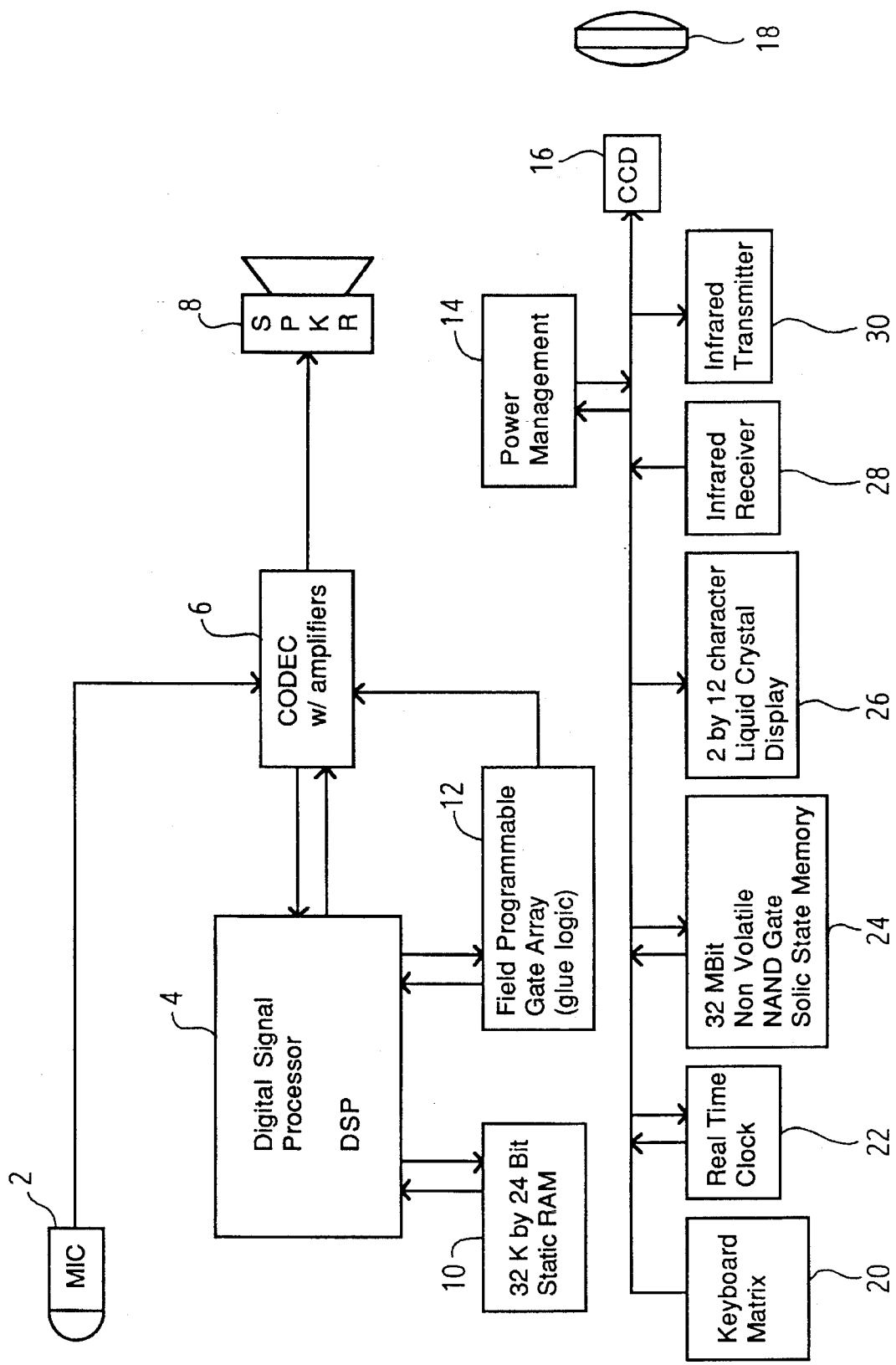
FIG. 1 is a schematic diagram of a portable documentation system according to the present invention with an optional video data module.

FIG. 1 is a schematic diagram of a personal documentation system designed in accordance with the present invention. Microphone 2 converts sound energy into an analog electrical signal that is transmitted to CODEC 6. CODEC 6 filters, amplifies and digitizes the signal received from Microphone 2. CODEC 6 transmits the digitized signal to DSP 4 in serial format. DSP 4 receives the digitized signal and performs digital filtering, windowing and mathematical analyses which yield linear predictor coefficients, pitch values, voice activity detection and other parameters used to compress and characterize speech signal features. DSP 4 compresses the speech signal data and stores it in NAND gate FLASH RAM 24.

Compressed speech signals recorded in FLASH RAM 24 are retrieved for playback by the this embodiment of the present invention by means of DSP 4. The digitized voice signal is then transmitted to CODEC 6, which converts the speech data into analog form. The analog signal is then presented to Speaker 8 which converts the signal to sound energy.

DSP 4 serves as the central processing unit of the disclosed preferred embodiment of the present invention. DSP 4 provides all signal processing functions and command interpretation and control means for all peripheral devices.

Static RAM 10 is partitioned to store 16K 24 bit words of program memory and 16K 16 bit words of data memory for use by DSP 4.

FPGA 12 is a field programmable gate array that provides the interface logic required by DSP 4 to communicate with and control all other elements designated in FIG. 1.

Power Management 14 circuitry provides turn on and turn off logic and voltage regulation and conversion control.

CCD 16 is a charge coupled device camera that captures visual data received from Lens 18. This visual data is compressed by DSP 4 and stored in FLASH RAM 24.

Keyboard 20 includes keys used to program both DSP 4 and FPGA 12 and select data locations within the directory tree structures. Keyboard 20 is routinely scanned for data input in periods of the order of 10 milliseconds.

Real-Time Clock 22 provides accurate date and time information used to data and time stamp voice and visual image data files. Clock 22 also provides wake-up logic to energize the device at specified instances or after set lengths of elapsed time.

FLASH RAM 24 stores all encoded audio and video data, file allocation maps, program code, data tree structure definitions and DSP 4 initialization data.

Alphanumeric Character Display 26 informs the user as to which data location is being accessed, and identifies which mode or state the system is experiencing.

Infrared Receiver 28 and Infrared Transmitter 30 allow bidirectional communications between the present invention and a corresponding transmitter/receiver set connected to a personal computer or other compatible devices.

Figure 2:
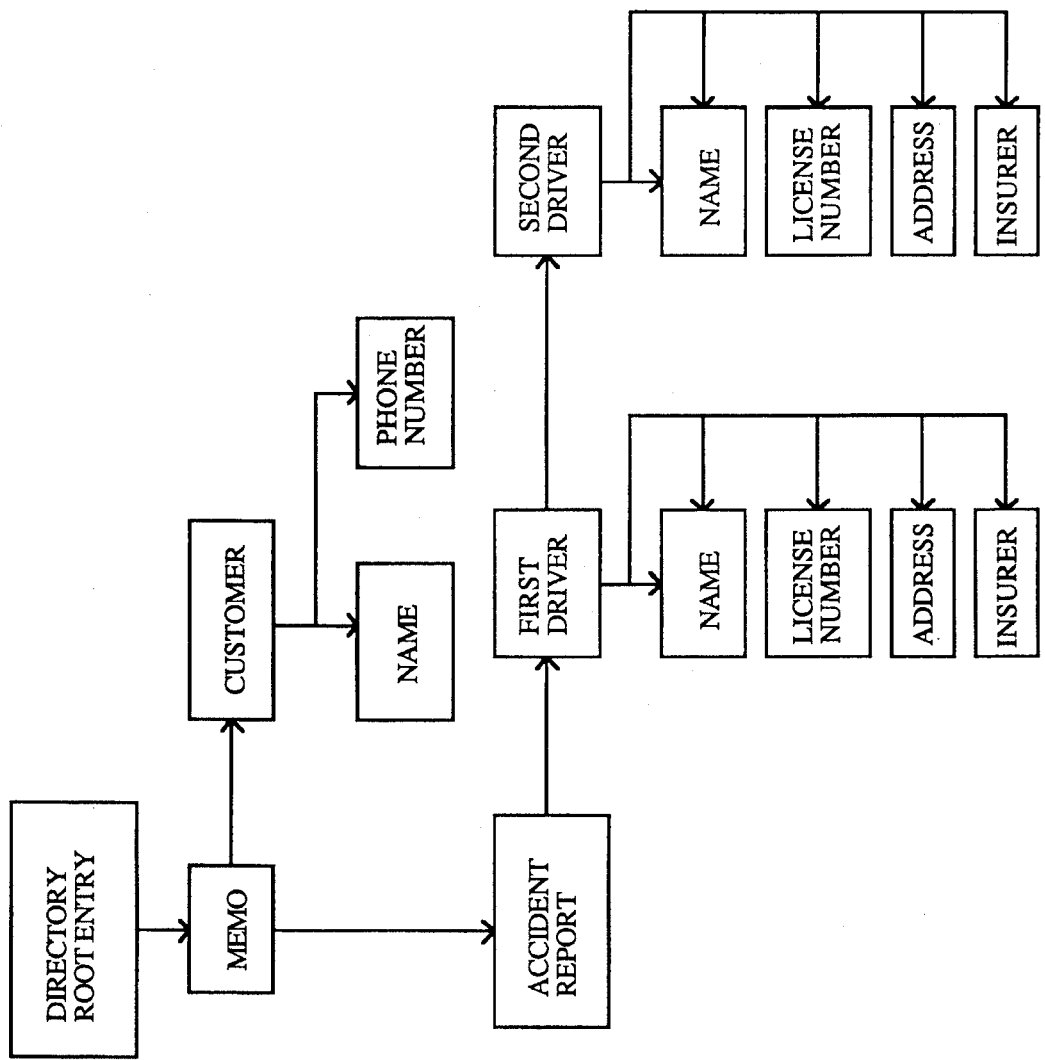
FIG. 2 illustrates a category tree embodiment of data formatting according to the present invention.

FIG. 2 illustrates a data tree structure embodiment according to the method of the present invention. Voice data is stored into specific data locations as designated by the system software. Individual voice data recordings can be entered into specific, pre-established data locations as selected by the user of the portable documentation system. More specifically, any audio signal containing information of relevance to a user of the present invention is herein referred to as an audio data notation. General purpose structures exist, such as appointment lists and customer names and phone numbers. Document-specific structures are also defined, such as a vehicular accident report. The example document structure includes data storage locations for information regarding drivers, vehicles and the accident location.

The definitions of all data tree structures, and labels of individual data locations, are stored in FLASH RAM 24 of FIG. 1. These definitions and labels can be input by means of infrared signal transmission, keyboard entry, and PCMCIA downloading (not shown).

Figure 3:
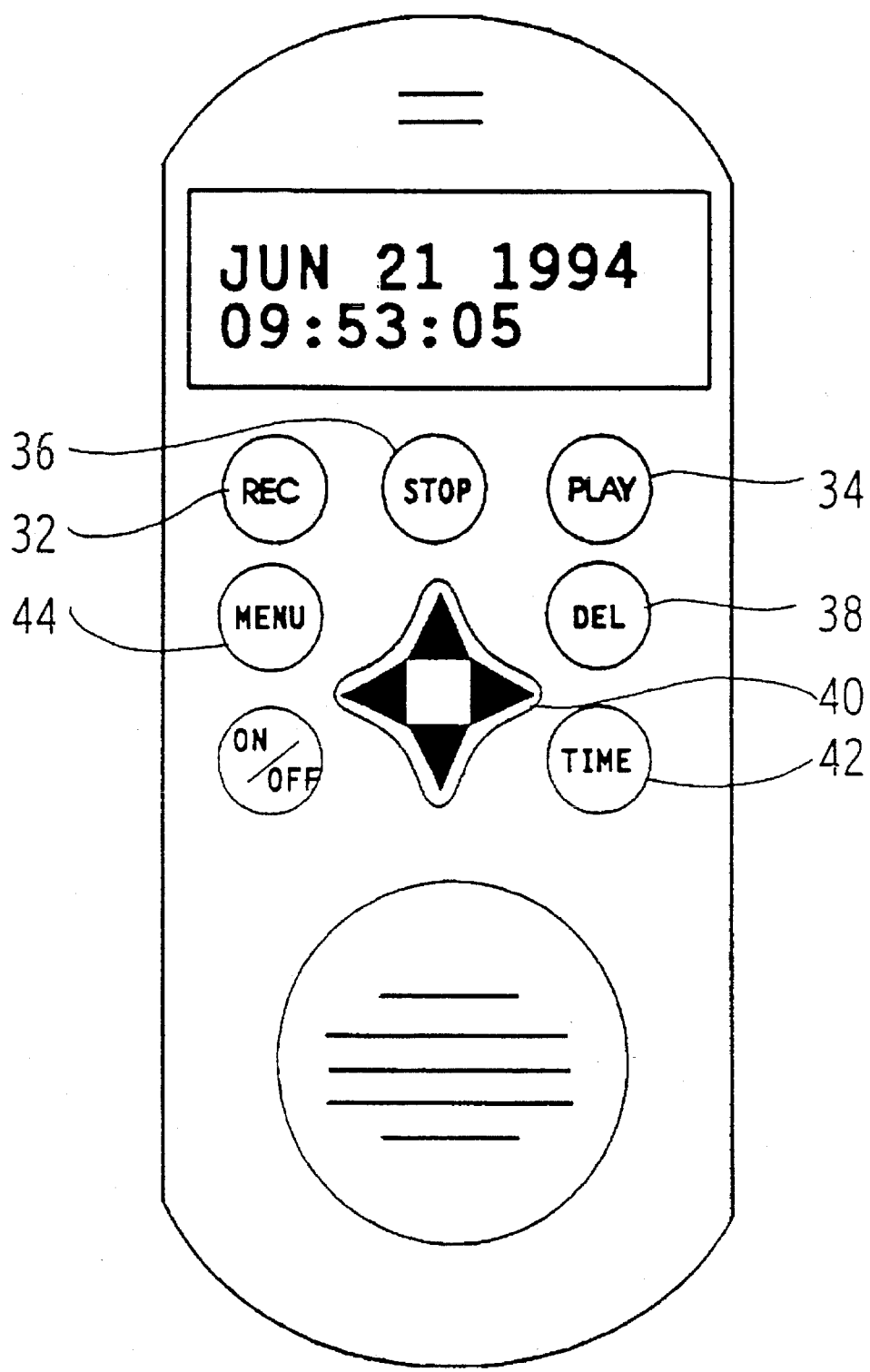
FIG. 3 illustrates a command and data entry keyboard of a preferred embodiment of the present invention.

FIG. 3 illustrates a command and data entry keyboard of a preferred embodiment of the present invention. A keyboard state-machine is defined in the system software which interprets key activity as clicks, double clicks, key held down, key released or no key activity. Key activity is interpreted within the context of specific conditions defined by the system software. The keys activate various functions as follows:

Rec 32 starts the data record mode.

Play 34 starts the play mode, wherein audio data previously recorded is transmitted as sound energy by means of the microphone of the apparatus.

Stop 36 stops either play or record activity. When an apparatus designed in accordance with the present invention is in menu or time modes, the activation of this key returns the apparatus to a standby mode.

Del 38 deletes the contents of an accessed data location, if activated while the apparatus is standby mode.

Cursor 40 is used to transverse the directory tree while standby mode is in effect. In play or record mode, the left and right keys control data location access within a given file, the up and down keys control playback volume.

Time 42 causes the current date and time as maintained by the real time clock of the apparatus to be displayed.

Menu 44 allows the modification of file attributes and initiates specific administrative actions.

Figure 4:
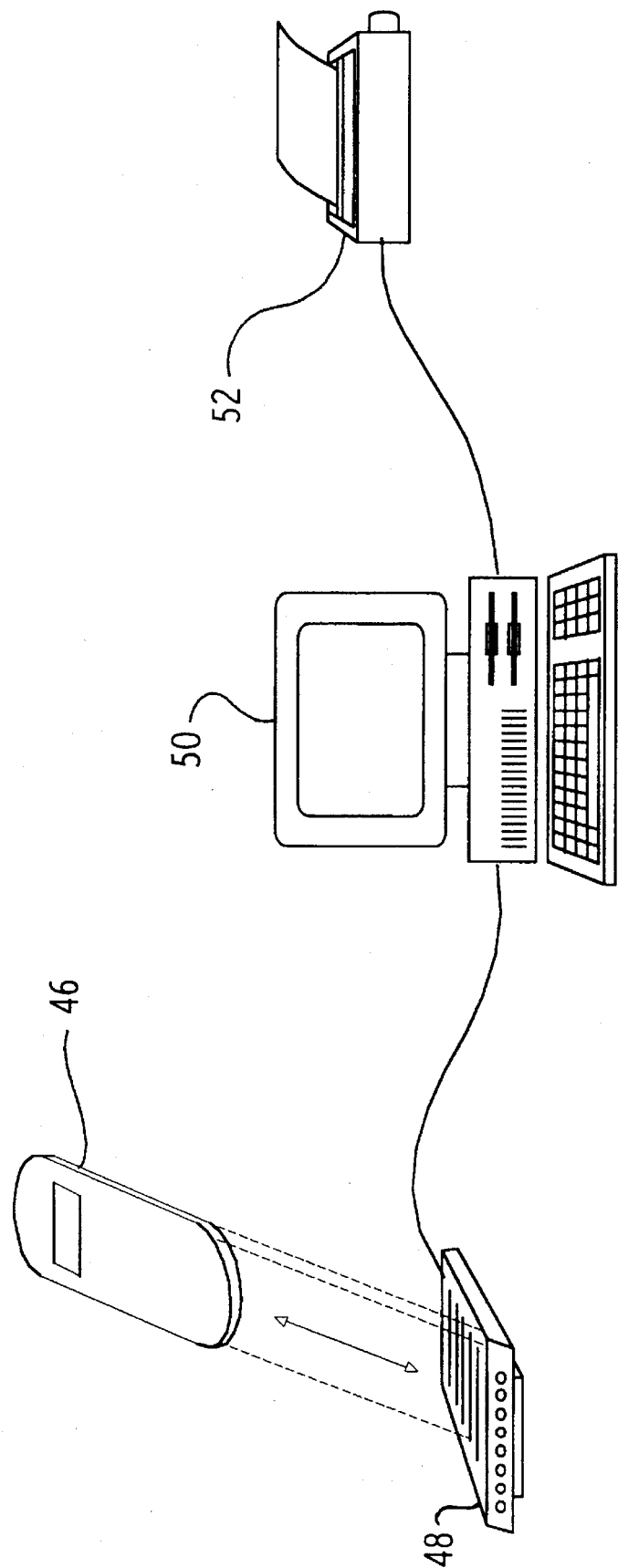
FIG. 4 is a block diagram of the present invention in combination with a personal computer.

FIG. 4 is a block diagram of the present invention in combination with a personal computer. Portable Documentation System 46 communicates with Personal Computer 50 via Infrared Docking Port 48. There is an IR data link which sends and receives infrared pulses between Portable Documentation System 46 and Infrared Docking Port 48. From Infrared Docking Port 48 the information is passed to Personal Computer 50. In the preferred embodiment, an RS-232 serial link is used, however, any other suitable date transmission link would be easily substituted. Within Personal Computer 50 voice recognition software is used to transcribe audio records into text data. The transcribed data is then accessible by means of magnetic media or by printed records generated by Printer 52. Video data stored by Personal Documentation System is transmitted to Personal Computer 46 in the same method as audio data.

What is claimed is:

1. A system for processing audio signals containing documentary information for automatic transcription into textual documentary records, comprising:

a first means for recording audio data notations containing said documentary information in a portable electronic device;

a second means for designating the relevance of each of the recorded audio data notations according to a specific predesignated documentary format;

a third means for automatically transcribing said audio data notations into textual information; and a fourth means for generating a formatted textual documentary record containing said documentary information contained in said audio data notations.

2. An apparatus for processing, recording and automatically transcribing audio information into preformatted textual documentation, comprising:

(a) a microphone for translating sound energy into electrical signals;

(b) a CODEC device, electrically connected to said microphone, and generating digitized electrical signals by digitizing said electrical signals, and transmitting said digitized electrical signals to a digital signal processor;

(c) said digital signal processor generating compressed digitized electrical signals by compressing said digitized electrical signals and storing said compressed digitized electrical signals into non-volatile solid state memory; and (d) a formatted data structure for designating the relevance of each of said compressed digitized electrical signals according to a specific predesignated documentary format; and (e) data transmission means for communicating said compressed digitized electrical signals to a personal computer/workstation, whereby said personal computer/workstation automatically transcribes said compressed digitized electrical signals in accordance with said formatted data structure into textual documentation.

* * * * *